United States Patent
Boutigny et al.

(10) Patent No.: US 7,340,011 B2
(45) Date of Patent: Mar. 4, 2008

(54) METHOD OF FREQUENCY MULTIPLICATION IN A RADIOCOMMUNICATIONS APPARATUS

(75) Inventors: Pierre-Henri Boutigny, Melun (FR); Herve Teillet, Maisons-Alfort (FR)

(73) Assignee: Thales, Paris (FR)

( * ) Notice: Subject to any disclaimer, the term of this patent is extended or adjusted under 35 U.S.C. 154(b) by 723 days.

(21) Appl. No.: 10/132,471

(22) Filed: Apr. 26, 2002

(65) Prior Publication Data
US 2002/0176515 A1 Nov. 28, 2002

(30) Foreign Application Priority Data
Apr. 27, 2001 (FR) ................................. 01 05729

(51) Int. Cl.
*H04L 27/30* (2006.01)
(52) U.S. Cl. .................. 375/308; 375/279; 332/103
(58) Field of Classification Search ............. 375/308, 375/239, 279, 329, 261, 298, 256, 259, 269; 332/103
See application file for complete search history.

(56) References Cited

U.S. PATENT DOCUMENTS

| | | | | | |
|---|---|---|---|---|---|
| 3,754,101 A | * | 8/1973 | Daspit et al. | ............... | 370/204 |
| 3,854,094 A | * | 12/1974 | Towler | ........................ | 455/112 |
| 4,176,319 A | * | 11/1979 | Kahn | ......................... | 455/109 |
| 4,355,404 A | * | 10/1982 | Uzunoglu | .................... | 375/332 |
| 4,585,998 A | * | 4/1986 | Veillard | ...................... | 329/301 |
| 5,237,292 A | * | 8/1993 | Chethik | ...................... | 332/103 |
| 5,309,479 A | * | 5/1994 | Cheah | ......................... | 375/303 |
| 5,640,125 A | * | 6/1997 | Alard | .......................... | 329/306 |
| 5,903,609 A | * | 5/1999 | Kool et al. | ................. | 375/261 |
| 6,242,990 B1 | * | 6/2001 | Sokolov | ..................... | 332/103 |
| 2001/0006539 A1 | * | 7/2001 | Kim | ............................ | 375/321 |

* cited by examiner

Primary Examiner—Jean B. Corrielus
(74) Attorney, Agent, or Firm—Oblon, Spivak, McClelland, Maier & Neustadt, P.C.

(57) ABSTRACT

Radiofrequency apparatus and method including at least one transmitter and/or receiver of a useful signal $S_0$, at least one device adapted to the application of a coefficient N to the useful signal $S_0$. The method includes modulating the useful signal $S_0$ with a frequency Fm, transposing the modulated signal $S_1$ to a frequency $F_m + F_{ol}$, and multiplying the transposed, modulated signal $S_3$ by a coefficient N in order to obtain a signal $S_4$ at a transmission frequency $F_e$.

7 Claims, 2 Drawing Sheets

METHOD OF FREQUENCY MULTIPLICATION IN A RADIOCOMMUNICATIONS APPARATUS

BACKGROUND OF THE INVENTION

1. Field of the Invention

The present invention relates to a radiocommunications apparatus comprising means suited to the application of a coefficient N to a useful signal or to useful signals sent out by the apparatus.

It can be applied to the multiplication of signal frequency by a coefficient N.

The expression "useful signal" hereinafter designates an information-carrier signal.

The invention is used in the phase modulation and/or frequency modulation of the useful signal.

It relates for example to radiocommunications apparatuses (using wireless beams, unicast links, multicast links etc) working in the millimetrical frequency band.

2. Description of the Prior Art

In radiocommunications apparatuses, the transmission system generally comprises a device used to transpose the information-carrying useful signal into a radiofrequency band. The frequency $F_{ol}$ of the local oscillator is therefore of the same magnitude as the transmission frequency $F_e$. This implies the development of functions in the high frequency ranges that are difficult to attain, especially in the millimeter range.

There are also known transmission systems where the frequency multiplication step is performed on the signal subjected to frequency transposition.

The invention relies on a novel approach in which the coefficient N is applied to the useful signal or signals transmitted by a radiocommunications apparatus.

SUMMARY OF THE INVENTION

The object of the invention relates to a radiofrequency apparatus comprising at least one transmitter of one or more useful signals $S_0'$ comprising at least one device adapted to the application of a coefficient N to the useful signal or signals $S_0'$ wherein said apparatus comprises at least one device adapted to the frequency modulation or phase modulation of the useful signal or signals with a frequency $F_m$, the multiplier device being positioned after said modulation device and at least one frequency transposition device and a device to mix the modulated useful signal $S_1$ at the frequency $F_m$ with the transposition frequency $F_{ol}$ in order to obtain a signal $S_3$ at a frequency $F_{rf}$ that is substantially equal to $F_{ol}+F_m$ and wherein the modulation is a phase modulation and the multiplication coefficient N is an odd number greater than or equal to m−1, where in is the number of states of the modulation.

The apparatus is used for example in the range of frequencies greater than 10 GHz and preferably greater than 25 GHz.

The invention also relates to a method used in an apparatus for the transmission and/or reception of one or more useful signals $S_0$ comprising at least one step in which a coefficient N is applied to the useful signal or signals, wherein the method comprises at least the following steps:

the phase modulation of the useful signal or signals $S_0$ with the frequency $F_m$, the transposition of the modulated signal $S_1$ to a frequency $F_m+F_{ol}$, with $F_{ol}$ being the transposition frequency, the multiplication of the transposed modulated signal $S_3$ by a coefficient N in order to obtain a signal $S_4$ at a transmission frequency $F_e$.

the coefficient N being an odd number, having a value greater than or equal to m−1, where m is the number of phase states of the modulation.

The invention offers especially the following advantages:
a simplified architecture of the high-frequency part of a transmission system,
the use of a minimum number of components in the radiofrequency part of the transmitter, for example,
the reduction of the number of chips in the case of a millimeter-band application. The chips used in millimeter-band applications are costly and their technological installation is difficult.
Reduced integration.

BRIEF DESCRIPTION OF THE DRAWINGS

Other advantages and characteristics of the invention shall appear more clearly from the following description, given by way of an illustration that in no way restricts the scope of the invention and made with reference to the appended drawings, of which.

MORE DETAILED DESCRIPTION

In order to provide for a clearer understanding of the object of the invention, the following description, given by way of an illustration that in no way restricts the scope of the invention, pertains a transmission system of a radiofrequency apparatus incorporating a device adapted to the multiplication by N of the useful signal or signals $S_0$ sent.

Without departing from the framework of the invention, the coefficient could be a division coefficient leading to a result identical to the one obtained with the multiplication coefficient.

Figure 1:
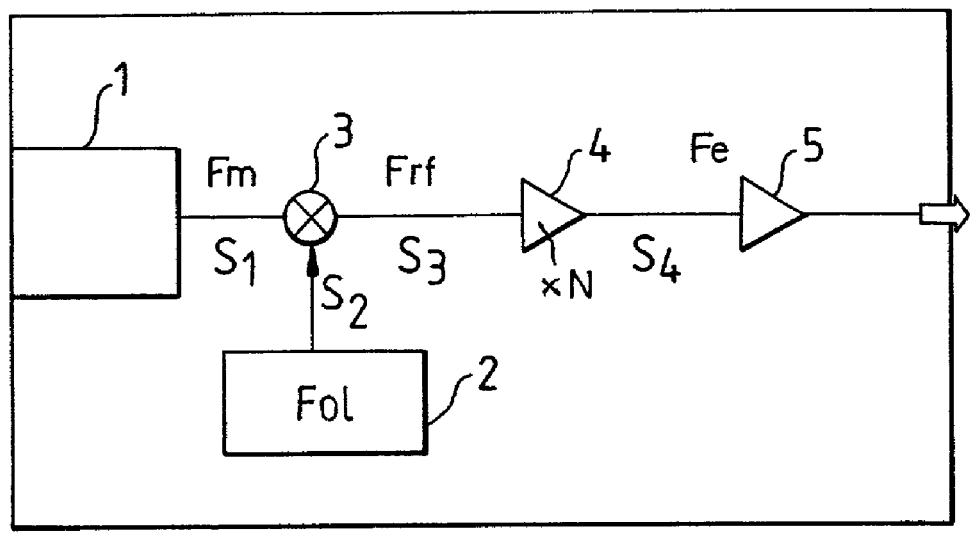
FIG. 1 is a drawing of a transmission system according to the invention.

FIG. 1 shows an exemplary transmission system of a radiofrequency apparatus.

The system comprises a modulator 1 giving a useful, information-carrier signal $S_1$ that is phase modulated and has a frequency $F_m$, a local oscillator 2 at a frequency $F_{ol}$ and a mixer 3. This mixer 3 receives the modulated useful signal and a signal $S_2$ at the frequency $F_{ol}$ in order to mix them and produce a signal $S_3$ at a frequency $F_{rf}$ that is equal or substantially equal to $F_m+F_{ol}$. This frequency-transposed signal $S_3$ is sent to a device 4 adapted to the multiplication of this signal by a coefficient N so as to produce a signal $S_4$ at the transmission frequency $F_e$, ($F_e=N(F_{ol}+F_m)$). The multiplied signal is then sent to an amplifier 5 through which it is given sufficient power for its transmission.

The multiplication by N of the signal $S_3$ with a frequency $F_{rf}$ and an initial phase $\Phi_r$ generates a transmission frequency $F_e=N.F_{rf}$ and a phase rotation $N.\Phi_r$.

The principle of operation of the transmission system in the case of phase modulation is described here below.

At output of the modulator 1, the signal $S_1$ with a frequency $F_m$ is modulated by phase leaps corresponding to the data or bits representing information to be sent. The letter m designates the number of states and depends on the phase modulation used.

a) for a BPSK (Binary Phase Shift Keying modulation) type modulation the modulated carrier may take the following form:

$$S_1(t) = A \times V(kT_s)\cos(2\pi F_m t + \phi(t))$$

with:
  A being a constant corresponding to the amplitude of the signal or signals,
  $V(kT_s) = +/-V$ in the time interval $[kT_s,(k+1)T_s]$, where $V(kT_s)$ represents the value of the bits that encode the information, $T_s$ the symbol time with $T_s = r*T_b$ where $T_b$ is the duration of a bit and r is the number of bits used to encode a piece of information.

The value of r depends on the modulation used, for example r=1 in BPSK.

The phases or phase leaps have the following value:

$$i \times \frac{2\pi}{m}$$

for i ∈ [0, . . . m−1],

In BPSK modulation, m=2 and two phase states 0 and π are thus obtained.

b) For a QPSK (Quadrature Phase Shift Keying) modulation the modulated carrier $S_1$ (t) takes the following expression:

$$S_1(t) = VI(kT_s)A\cos(2\pi F_m t) + VQ(kT_s)A\sin(2\pi F_m t)$$

$$= 1.41 AV \cos(2\pi F_m t - \varphi(k))$$

There are then two possible choices for the values of VI and VQ in the time interval $[kT_s, (k+1)T_s]$:
First case: $VI(kT_s) = +/-V$ and $VQ(kT_s) = +/-V$
$2^{nd}$ case: $(VI(kT_s), VQ(kT_s)) = [(V,0), (-V,0), (0,V), (0,-V)]$
where
  $VI(kT_s)$ and $VQ(kT_s)$ represent the value of the bits that encode the information,
  $T_s$ is the symbol time, with $Ts = r*T_b$ where $T_b$ is the duration of a bit and r is the number of bits used to encode a piece of information, the value of r is a function of the modulation used, for example r=2 in QPSK.

The corresponding phases or phase leaps are equal to:
  in the first case, $$\pm (2i+1) \times \frac{\pi}{m}$$

for i ∈ [0, . . . (m/2)−1] with m=4 in QPSK leading to four phase states +/-(π/4) and +/-(3π/4) and
  in the $2^{nd}$ case, $$i \frac{2\pi}{m}$$

for i ∈ [0, . . . m−1], leading to four phase states 0, π/2, π, 3π/2 for the QPSK modulation.

The coefficient m representing the number of phase states for a given modulation is $m = 2^r$. The value of the coefficient r depends on the modulation used.

For example, for the BPSK modulation, r=1 and m=2, for QPSK modulation, r=2 and m=4.

The value of the multiplication coefficient N is chosen for example as a function of the architecture of the transmission system and the performance of the radiofrequency apparatus.

In the case of a QPSK type of modulation, with a frequency multiplication coefficient N chosen as being an odd number with a value greater than or equal to (m−1), the original phase leaps $$i \times \frac{2\pi}{m} \text{ or } \pm (2i+1) \times \frac{\pi}{m}$$

become respectively phase leaps of $$N\left[i \times \frac{2\pi}{m}\right] \text{ or } \pm (2i+1) \times \frac{\pi}{m}.$$

In this example, all the phase states modulo 2π are obtained.

Figure 2:
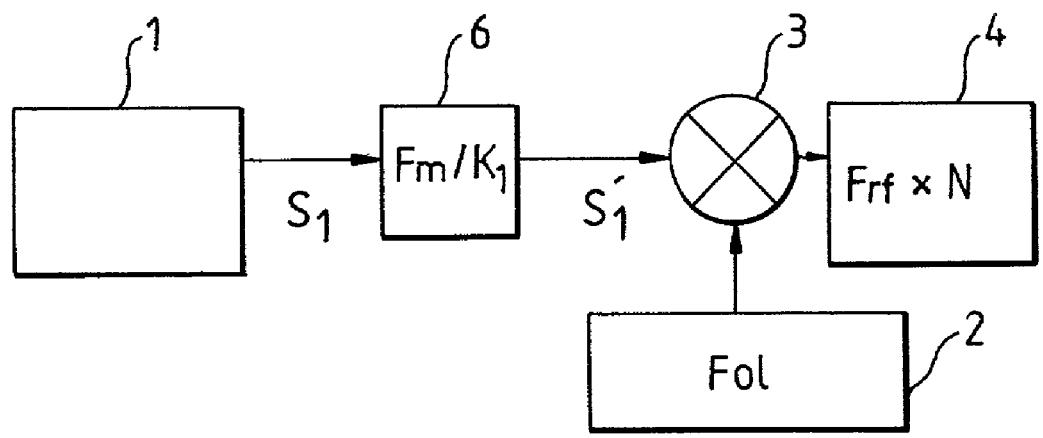
FIG. 2 is an alternative embodiment of the transmission system of FIG. 1, including a frequency divider.

FIG. 2 gives a schematic view of a first alternative embodiment of the device described in FIG. 1, providing especially for an improvement in the spectral performance of the signal obtained after multiplication.

To this end, the transmission system comprises, in addition to the elements described in FIG. 1, a frequency divider 6 positioned before the mixer 3. This divider divides the modulated useful signal $S_1$ having a frequency $F_m$ by a coefficient $K_1$, in order to obtain a signal $S'_1$ with a frequency $F_m/K_1$ and then carries out the frequency transposition by means of the frequency $F_{ol}$ of the local oscillator 2.

Figure 3:
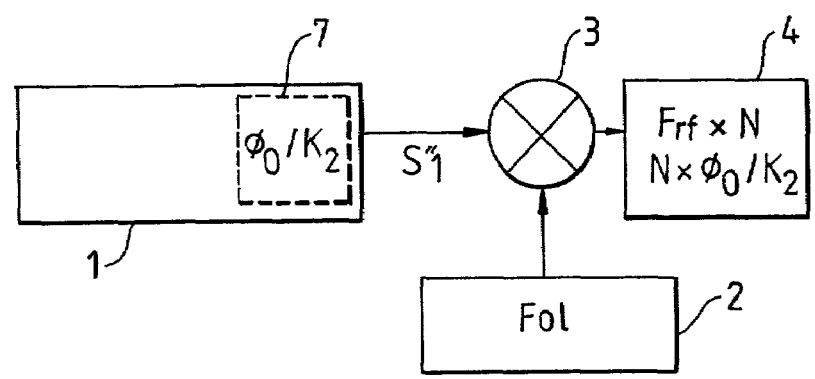
FIG. 3 shows an alternative embodiment of the transmission system of FIG. 1 integrating a phase divider.

FIG. 3 gives a schematic view of the second alternative embodiment in which the transmission system comprises a phase divider 7 having a division coefficient $K_2$. This divider is integrated for example into the modulator 1.

Without departing from the framework of the invention, the divider may be located outside the modulator.

The modulator 1 produces a signal $S''_1$, whose phase Φ is divided by a coefficient $K_2$ giving $\Phi/K_2$. This signal is then transmitted to the mixer in order to undergo frequency transposition by means of the frequency $F_{ol}$ according to the scheme described with reference to FIG. 1 for example.

The values of the coefficients $K_1$ and $K_2$ are chosen for example according to criteria similar to those used for the choice of the multiplication coefficient N.

The fact of performing a division gives especially the following possibilities:
  multiplying by any coefficient N, chosen in accordance with the above-mentioned criteria without any limiting condition in order to find all the modulo 2π states, the division coefficient being then equal to number N,
  being able to make a filtering, after division, in a narrower bandwidth which is in the range of the bit rate (for a bit rate of 4 Mbits, the bandwidth needed is a minimum of about 4 MHz; this is the baseband). Indeed, after multiplication, it is not possible to filter the information-carrier signal in a band of less than N*(baseband) without impairment of transmission quality.

Figure 4:
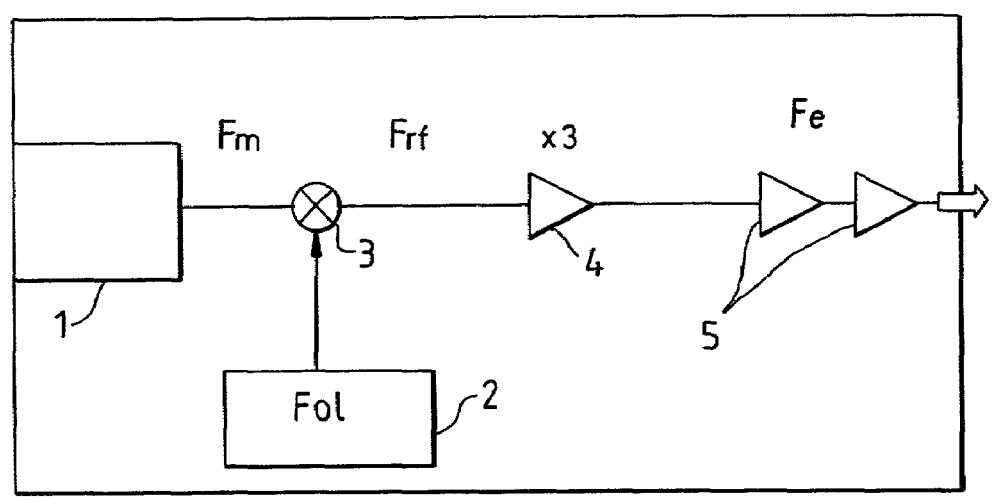
FIG. 4 shows a quantitative example of the implementation of the invention.

FIG. 4 shows a quantitative example of an implementation of the invention.

The phase modulator 1 generates a frequency $F_m$ at 1 GHz modulated by phase leaps corresponding to the data. The phase leaps are not filtered and the modulated signal obtained is a modulated signal with constant envelope.

The frequency $F_m$ is then transposed by the local oscillator at 12.5 GHz to obtain a signal whose frequency $F_{rf}$ is equal to 13.5 GHz. The signal is then multiplied by 3, using a frequent multiplier-amplifier by 3, and then sent on to a set of amplifiers 5 in order to give it the required transmission value.

The constant envelope modulation makes it possible especially to saturate the transmission system without impairing transmission performance.

The choice for the value of N is, for example, a function of the modulation.

In BPSK modulation, the original phase leaps, 0/π, become 0/3π phase leaps. This again gives 0/π (modulo 2π).

In QPSK modulation, the phase leaps 0, π/2, π, 3 π/2, become 0, 3π/2, 3 π and 9 π/2 namely 0, π/2, π and 3π/2 (modulo 2π).

In the two examples mentioned above, the phase states modulo 2π, are found again.

The device described above can be applied to all frequency values but prove to be particularly valuable in the case of a transposition frequency source that is difficult to obtain or is of high cost. This corresponds to high local oscillator and RF radiofrequencies.

The above example implements a phase modulation. However it can be used, without departing from the framework of the invention, for a frequency modulation.

Although the principle implemented in the present invention has been given for a transmission system, the invention can also be applied to a reception system in a radiofrequency apparatus.

Similarly, any modulation other than the BPSK, QPSK modulation mentioned here above that keeps a constant or substantially constant envelope may be used within the framework of the present invention.

What is claimed is:

1. A radiofrequency apparatus comprising:
   an input for receiving at least one signal $S_0'$,
   at least one multiplication device adapted to the application of a multiplication coefficient N to the at least one signal $S_0'$ to obtain a signal $S_4$ at a transmission frequency $F_e$,
   at least one phase modulation device adapted to modulate at least one signal $S_1$ with a frequency $F_m$,
   at least one frequency transposition device,
   a device configured to mix the modulated signal $S_1$ at the frequency $F_m$ with a transposition frequency $F_{ol}$, in order to obtain a signal $S_3$ at a frequency $F_{rf}$ that is substantially equal to $F_{ol}+F_m$,
   wherein the at least one multiplication device is positioned after said at least one modulation device, the at least one frequency transposition device and the device configured to mix the modulated signal $S_1$ at the frequency $F_m$ with a transposition frequency $F_{ol}$,
   wherein the multiplication coefficient N is an odd number greater than or equal to m−1, where m is the number of states of the modulation.

2. The apparatus according to claim 1, further comprising a frequency division device configured to perform frequency division by a coefficient $K_1$, said frequency division device being positioned before the multiplication device.

3. The apparatus according to claim 1, further comprising a phase division device configured to perform phase division by a coefficient $K_2$, said phase division device being positioned before the multiplication device.

4. The apparatus according to one of the claims 1 to 3, wherein the phase modulation is of BPSK or QPSK type.

5. The apparatus according to claim 1, wherein the apparatus is used in the range of frequencies that are higher than 10 GHz.

6. A method of using an apparatus for the transmission of at least one useful signal $S_0$, comprising at least the following steps:
   phase modulating the at least one useful signal $S_0$ with the frequency $F_m$ to produce phase modulated signal $S_1$;
   transposing the phase modulated signal $S_1$ to a modulated signal $S_3$ having a frequency $F_m+F_{ol}$, with $F_{ol}$ being the transposition frequency;
   multiplying the transposed modulated signal $S_3$ by a coefficient N to obtain a signal $S_4$ at a transmission frequency $F_m$,
   wherein the coefficient N is an odd number having a value greater than or equal to m−1, where m is the number of phase states of the phase modulation.

7. The method according to claim 6 wherein the phase modulation is of BPSK or QPSK type.

* * * * *